(12) United States Patent
Moran

(10) Patent No.: US 7,315,000 B2
(45) Date of Patent: Jan. 1, 2008

(54) ELECTRONIC MODULE WITH DUAL CONNECTIVITY

(75) Inventor: Dov Moran, Kfar Saba (IL)

(73) Assignee: Sandisk IL Ltd., Kfar Saba (IL)

( * ) Notice: Subject to any disclaimer, the term of this patent is extended or adjusted under 35 U.S.C. 154(b) by 0 days.

(21) Appl. No.: 10/735,668

(22) Filed: Dec. 16, 2003

(65) Prior Publication Data

US 2005/0016767 A1    Jan. 27, 2005

Related U.S. Application Data

(60) Provisional application No. 60/490,973, filed on Jul. 27, 2003.

(51) Int. Cl.
*H01R 12/04* (2006.01)
*H05K 1/11* (2006.01)

(52) U.S. Cl. .................. 174/261; 361/800; 257/736

(58) Field of Classification Search ............... 174/261; 361/785–791, 803; 257/736
See application file for complete search history.

(56) References Cited

U.S. PATENT DOCUMENTS

| | | | | |
|---|---|---|---|---|
| 4,996,587 A | * | 2/1991 | Hinrichsmeyer et al. | ... 257/676 |
| 5,045,381 A | * | 9/1991 | Suzuki et al. | ............... 428/209 |
| 5,481,133 A | * | 1/1996 | Hsu | ........................... 257/621 |
| 5,569,955 A | * | 10/1996 | Chillara et al. | ............ 257/666 |
| 5,814,883 A | * | 9/1998 | Sawai et al. | ................ 257/712 |
| 5,873,512 A | * | 2/1999 | Bielick et al. | ............. 228/216 |
| 5,999,415 A | * | 12/1999 | Hamzehdoost | ............. 361/803 |
| 6,020,629 A | * | 2/2000 | Farnworth et al. | ......... 257/686 |
| 6,081,430 A | * | 6/2000 | La Rue | ..................... 361/788 |
| 6,093,029 A | * | 7/2000 | Kwon et al. | .................. 439/69 |
| 6,097,086 A | * | 8/2000 | Crane et al. | ................ 257/692 |
| 6,204,915 B1 | * | 3/2001 | Persegol et al. | ........... 356/73.1 |
| 6,222,259 B1 | * | 4/2001 | Park et al. | ................... 257/690 |
| 6,483,718 B2 | * | 11/2002 | Hashimoto | .................. 361/803 |
| 7,010,629 B1 | * | 3/2006 | Frame et al. | ............... 710/100 |

* cited by examiner

*Primary Examiner*—Jeremy C Norris
(74) *Attorney, Agent, or Firm*—Mark M. Friedman

(57) ABSTRACT

An electronic module includes electronic circuitry and first and second connection mechanisms, both operationally connected to the electronic circuitry, for mounting the module in a larger electronic device by different respective methods. Preferably, the first connection mechanism is a robotic connection mechanism such as a BGA with one or more solder balls and the second connection mechanism is a manual connection mechanism such as a plug with one or more electrically conducting pads, both mechanisms being for mounting the module on a PCB.

3 Claims, 2 Drawing Sheets

ELECTRONIC MODULE WITH DUAL CONNECTIVITY

This is a continuation-in-part of U.S. Provisional Patent Application Ser. No. 60/490,973, filed Jul. 27, 2003.

FIELD AND BACKGROUND OF THE INVENTION

The present invention relates to an electronic module adapted to be operationally connected to a larger electronic device in either of two different ways and, more particularly, to an electronic module adapted to be connected to a printed circuit board (PCB) either robotically or manually.

PCBs are used extensively in the electronics industry. Using PCBs, manufacturers in all segments of the electronics industry employ techniques that originated in the printing industry for mass production of electronic parts. A typical PCB bears mounted thereon solid-state modules and passive modules that are interconnected by conductive wires imprinted on the PCB. Often, a smaller PCB is mounted as a module on a larger PCB.

When a module is mounted on a PCB, the module is physically and electrically connected to the PCB by a suitable permanent or temporary connection. There are two types of such connections in common use: connections designed for robotic installation using surface mounting technology (SMT), and connections designed for manual assembly.

FIG. 1 is a high level schematic block diagram of a prior art electronic module 10 designed for SMT assembly. Module 10 includes an electrically insulating plastic body 5 that bears electronic circuitry 4 and a ball grid array (BGA) 1. Electronic circuitry 4 and BGA 1 are operationally connected by a plurality 9 of wires that provide electrical power supply and signal transfer. The number of wires in plurality 9 is determined by the application that uses electronic circuitry 4. For each of the wires of plurality 9, BGA 1 has a tiny solder ball of hemispherical shape. Module 10 is mounted on a compatible PCB (not shown) by an SMT robot that places module 10 in the correct position relative to the PCB, with the solder balls of BGA 10 in contact with matching electrical connectors on the PCB, and then melts the solder balls to form an electrical connection between the solder balls' respective wires and the matching electrical connectors. FIG. 2 is a top view of an exemplary electronic module 10. Body 5 of module 10 of FIG. 2 bears an exemplary set of four solder balls 1A through 1D. FIG. 3 is a side view of module 10 of FIG. 2, showing solder balls 1C and 1D, body 5 and electronic circuitry 4. Balls 1A-1D are connected to electronic circuitry 4 by a set 9 of four respective wires that span body 5 and so are not visible in FIGS. 2 and 3.

FIG. 4 is a high level schematic block diagram of another prior art electronic module 20 designed for manual assembly. Module 20 includes an electrically insulating plastic body 5 that bears electronic circuitry 4 and a plug 2. Electronic circuitry 4 and plug 2 are operationally connected by a plurality 9' of wires that provide electrical power supply and signal transfer. The number of wires in plurality 9' is determined by the application that uses electronic circuitry 4. For each of the wires of plurality 9', plug 2 has an elongated, electrically conducting pad. Module 20 is mounted manually on a compatible PCB (not shown) by plugging plug 2 into a matching socket that is mounted on the PCB, thereby bringing each pad of plug 2 in contact with a matching electrically conducting pad in the socket. FIG. 5 is a top view of an exemplary electronic module 20. Body 5 of module 20 of FIG. 5 bears an exemplary set of four pads 2A-2D. FIG. 6 is a side view of module 20 of FIG. 5, showing pad 2D, body 5 and electronic circuitry 4. Pads 2A-2D are connected to electronic circuitry by a set 9' of four respective wires that span body 5 and so are not visible in FIGS. 5 and 6.

Sometimes, it is desirable to manually mount a module 10, that is intended for robotic mounting, on a PCB, for example for prototyping or testing. Alternatively, a manufacturer may desire to integrate an off-the-shelf module 20, that was originally intended for manual mounting, in an automated production line in which electronic modules are mounted robotically on PCBs. In either case, according to the prior art, an adapter component would have to be added to the module 10 or 20, to convert the assembly method from robotic to manual or from manual to robotic. In the case of integrating a manual module 20 in an automatic production line, this also entails adding another production step. Furthermore, the PCB, on which the module 10 or 20 is to be mounted, may not have room for the adapter component.

There is thus a widely recognized need for, and it would be highly advantageous to have, an electronic module with dual connectivity, so that the module could be mounted on a PCB board either robotically or manually.

SUMMARY OF THE INVENTION

The present invention provides an electronic module with dual connectivity that allows selectably connecting the module by one of two different methods, for example either robotic or manual assembly, without the need for an adapter.

According to the present invention there is provided an electronic module, including: (a) electronic circuitry; (b) a first connection mechanism, operationally connected to the electronic circuitry, for mounting of the electronic module by a first method; and (c) a second connection mechanism, operationally connected to the electronic circuitry, for mounting of the electronic module by a second method different from the first method.

A basic electronic module of the present invention includes electronic circuitry and two different connection mechanisms. Both connection mechanisms are operationally connected to the electronic circuitry. The first connection mechanism is for mounting the electronic module within a larger electronic device (and typically on a PCB) by a first method. The second mechanism is for mounting the electronic module within a larger electronic device (again, typically, on a PCB) by a second method that is different from the first method. Preferably, the first method is robotic mounting and the second method is manual mounting.

Preferably, either the first connection mechanism, or the second connection mechanism, or both, are directly operationally connected to the electronic circuitry, for example by one or more wires that directly connect the connection mechanism(s) to the electronic circuitry. Alternatively, the first connection mechanism is directly operationally connected to the electronic circuitry and the second connection mechanism is directly operationally connected to the first connection mechanism, but is only indirectly operationally connected to the electronic circuitry via the first connection mechanism. Under yet another alternative, the second connection mechanism is directly operationally connected to the electronic circuitry and the first connection mechanism is directly operationally connected to the second connection mechanism, but is only indirectly connected to the electronic circuitry via the second connection mechanism.

Preferably, the first connection mechanism includes one or more substantially hemispherical solder balls. Preferably, the second connection mechanism includes one or more electrically conducting pads. More preferably, the first connection mechanism includes one or more substantially hemispherical solder balls and the second connection mechanism includes a like number of electrically conducting pads. Most preferably, the solder balls are paired up with respective electrically conducting pads, and are operationally connected to their respective electrically conducting pads by respective wires.

Preferably, the electronic module also includes an electrically insulating (e.g. plastic) body on which the electronic circuitry and the two connection mechanisms are mounted. More preferably, the two connection mechanisms are mounted on the same side of the body.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of an electronic module that can be mounted in a larger electronic device by one of two different methods. Specifically, the present invention can be mounted on a PCB either robotically or manually.

The principles and operation of an electronic module according to the present invention may be better understood with reference to the drawings and the accompanying description.

Figure 1:
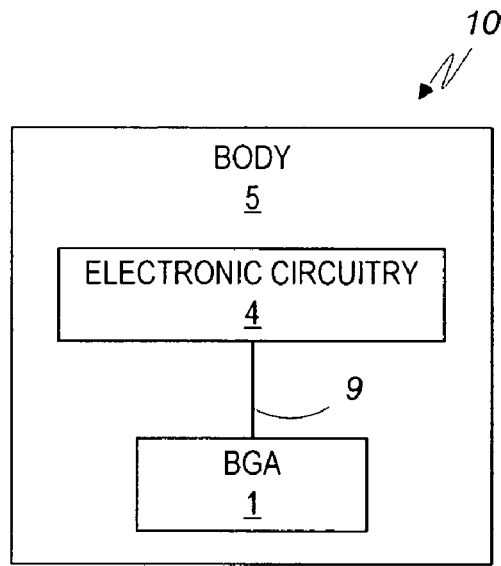
FIG. 1 is a high level schematic block diagram of a prior art electronic module designed for robotic assembly.
Figure 2:
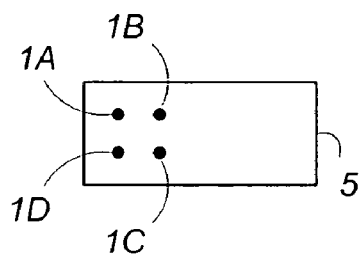
FIG. 2 is a top view of an exemplary embodiment of the prior art electronic module of FIG. 1.
Figure 3:
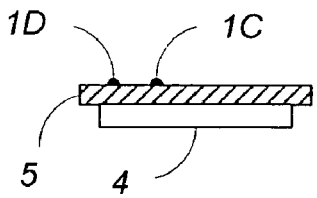
FIG. 3 is a side view of the exemplary embodiment of FIG. 2.
Figure 4:
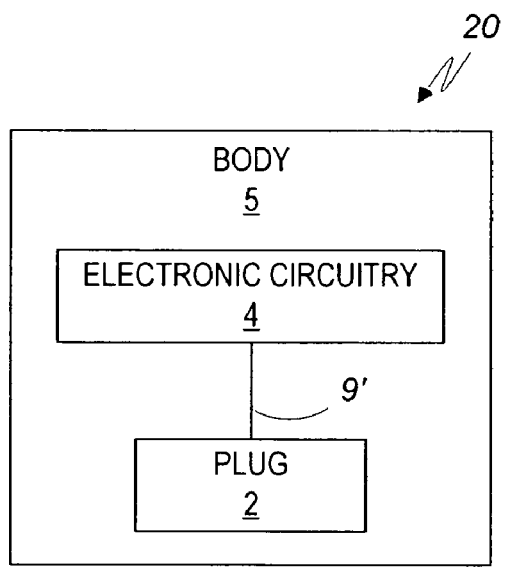
FIG. 4 is a high level schematic block diagram of a prior art electronic module designed for manual assembly.
Figure 5:
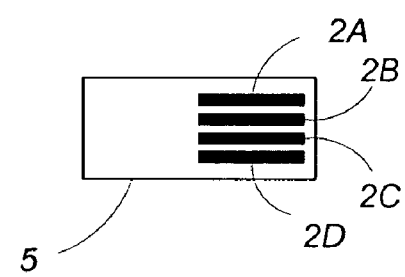
FIG. 5 is a top view of an exemplary embodiment of the prior art electronic module of FIG. 4.
Figure 6:
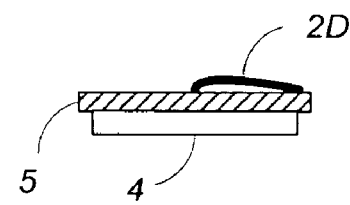
FIG. 6 is a side view of the exemplary embodiment of FIG. 5.
Figure 7:
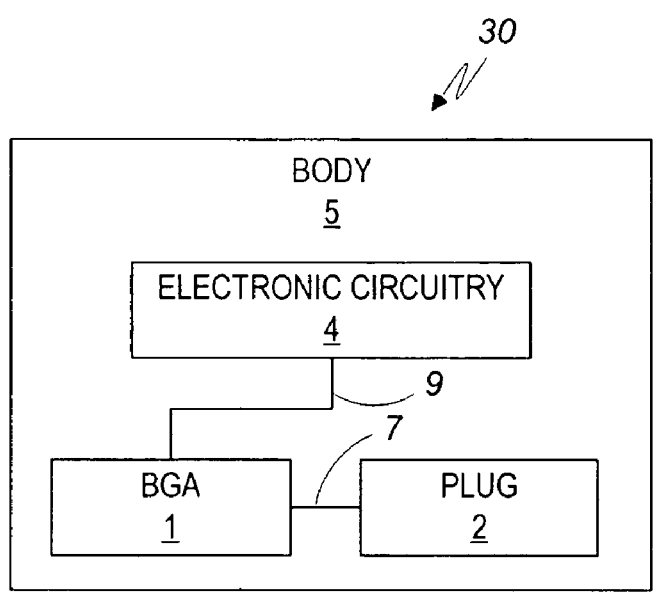
FIG. 7 is a high level schematic block diagram of an electronic module of the present invention.
Figure 8:
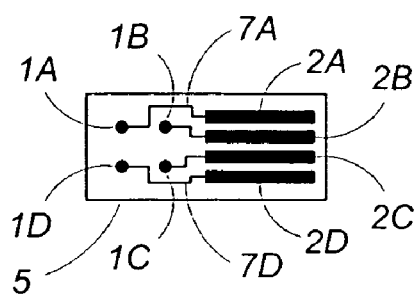
FIG. 8 is a top view of an exemplary embodiment of the electronic module of FIG. 7.

Returning now to the drawings, FIG. 7 is a high level schematic block diagram of a preferred embodiment 30 of an electronic module according to the present invention that can be mounted either robotically or manually. Module 30 includes an electrically insulating plastic body 5 that bears electronic circuitry 4, a BGA 1 and a plug 2. Electronic circuitry 4 and BGA 1 are operationally connected by a plurality 9 of wires that provide electrical power supply and signal transfer. The number of wires in plurality 9 is determined by the application that uses electronic circuitry 4. Plug 2 is operationally connected to BGA 1 by a plurality 7 of wires. When module 30 is mounted on a compatible PCB (not shown) by an SMT robot, each solder ball of BGA 1 is melted to form an electrical connection between the solder ball's respective wire and matching electrical connectors on the PCB. When module 30 is manually plugged into a compatible socket of a PCB (not shown), each pad of plug 2 comes into electrical contact with a matching pad that is part of the socket, establishing electrical contact between the PCB and electronic circuitry 4 via wire pluralities 7 and 9. FIG. 8 is a top view of an exemplary electronic module 30.

Figure 9:
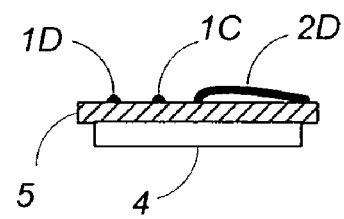
FIG. 9 is a side view of the exemplary embodiment of FIG. 8.

Body 5 of module 30 of FIG. 8 bears an exemplary set of four solder balls 1A-1D and an exemplary set of four pads 2A-2D, interconnected by four printed wires 7A-7D. FIG. 9 is a side view of module 30 of FIG. 8, showing solder balls 1D and 1C, pad 2D, body 5 and electronic circuitry 4. Solder balls 1A-1D and pads 2A-2D are connected to electronic circuitry 4 by the four wires of plurality 7 and by the four wires of plurality 9. The four wires of plurality 7 are flush with the top of body 5 and so are not visible in FIG. 9. The four wires of plurality 9 span body 5 and so are not visible in FIG. 9.

In the preferred embodiment of FIGS. 7-9, BGA 1 is directly operationally connected to electronic circuitry 4, and plug 2 is directly operationally connected to BGA 1. Plug 2 is indirectly operationally connected to electronic circuitry 4, via BGA 1. This preferred embodiment is only exemplary. Many variations are possible within the scope of the present invention. In one such variation, plug 2 is directly operationally connected to electronic circuitry 4, and BGA 1 is directly operationally connected to plug 2, so that BGA 1 is indirectly operationally connected to electronic circuitry 4, via plug 2. In another such variation, both BGA 1 and plug 2 are directly operationally connected to electronic circuitry 4. Furthermore, BGA 1 and plug 2 are only examples of, respectively, a robotic connection mechanism and a manual connection mechanism. The robotic connection mechanism of the present invention may be any type of electrical connection that allows robotic assembly. The manual connection mechanism of the present invention may be any type of electrical connection that allows manual assembly.

It also will be appreciated that electronic module 30 may be any component, device or sub-assembly that requires operational connection to a larger electronic device, and that connection to a PCB is only a typical example of such operational connection.

While the invention has been described with respect to a limited number of embodiments, it will be appreciated that many variations, modifications and other applications of the invention may be made.

What is claimed is:

1. An electronic module, comprising:
   (a) electronic circuitry;
   (b) a first connection mechanism, including at least one substantially hemispherical solder ball, and operationally connected to said electronic circuitry, for mounting of the electronic module on a printed circuit board by a first method; and
   (c) a second connection mechanism, including at least one electrically conducting pad, and operationally connected to said electronic circuitry, for mounting of the electronic module on a printed circuit board by a second method different from said first method;
   wherein mounting using only said first connection mechanism suffices to render the electronic module fully operational; and wherein mounting using only said second connection mechanism suffices to render the electronic module fully operational.

2. The electronic module of claim 1, wherein said at least one solder ball and said at least one pad are like in number.

3. The electronic module of claim 2, further comprising:
   (d) for each said solder ball, and for a respective said pad, a respective wire operationally connecting said each solder ball to said respective pad.

* * * * *